(12) United States Patent
Mitra et al.

(10) Patent No.: US 11,088,075 B2
(45) Date of Patent: Aug. 10, 2021

(54) LAYOUT STRUCTURES WITH MULTIPLE FINGERS OF MULTIPLE LENGTHS

(71) Applicant: GLOBALFOUNDRIES U.S. Inc., Santa Clara, CA (US)

(72) Inventors: Souvick Mitra, Essex Junction, VT (US); Rainer Thoma, Essex Junction, VT (US); Harsh Shah, South Burlington, VT (US); Anindya Nath, Essex Junction, VT (US); Robert J. Gauthier, Jr., Williston, VT (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 42 days.

(21) Appl. No.: 16/671,414

(22) Filed: Nov. 1, 2019

(65) Prior Publication Data

US 2021/0134719 A1 May 6, 2021

(51) Int. Cl.
*H01L 23/528* (2006.01)
*H01L 21/74* (2006.01)
*H01L 29/417* (2006.01)
*H01L 23/522* (2006.01)

(52) U.S. Cl.
CPC ........ *H01L 23/5283* (2013.01); *H01L 21/743* (2013.01); *H01L 23/5221* (2013.01); *H01L 29/41791* (2013.01)

(58) Field of Classification Search
CPC ............. H01L 23/5283; H01L 23/5221; H01L 29/41791; H01L 21/743
See application file for complete search history.

(56) References Cited

U.S. PATENT DOCUMENTS

| 5,384,488 A * | 1/1995 | Golshan ................ H01L 23/528 257/692 |
| 6,518,604 B1 | 2/2003 | Worley et al. |
| 8,138,558 B2 | 3/2012 | Shea et al. |
| 10,734,343 B2 * | 8/2020 | Rinne ..................... H01L 24/14 |
| 2007/0210391 A1 * | 9/2007 | Becker ................ H01L 23/5283 257/390 |
| 2011/0074047 A1 * | 3/2011 | Pendse .................... H01L 24/11 257/782 |

OTHER PUBLICATIONS

Avner Friedman, "Mathematics in Industrial Problems", Chapter 1, Part 10, vol. 100. Springer New York 1998.
M. Ershov, et al., "Numerical simulation of metal interconnects of power semiconductor devices," 2010 22nd International Symposium on Power Semiconductor Devices & IC's (ISPSD), Hiroshima, 2010, pp. 185-188.
Christopher D. Ochs, Metal Conductor Structure Having Low Electro-Migration at High Currents for Semiconductor Devices, Published Nov. 6, 1990 as United Stats Statutory Invention Registration No. H842.

* cited by examiner

*Primary Examiner* — Nicholas J Tobergte
(74) *Attorney, Agent, or Firm* — Thompson Hine LLP; Francois Pagette

(57) ABSTRACT

Back-end-of-line layout structures and methods of forming a back-end-of-line layout structure. A metallization level includes a plurality of interconnects positioned over a plurality of active device regions. The plurality of interconnects have a triangular-shaped layout and a plurality of lengths within the triangular-shaped layout.

20 Claims, 6 Drawing Sheets

LAYOUT STRUCTURES WITH MULTIPLE FINGERS OF MULTIPLE LENGTHS

BACKGROUND

The present invention relates to semiconductor device fabrication and integrated circuits and, more specifically, to back-end-of-line layout structures and methods of forming a back-end-of-line layout structure.

Complementary-metal-oxide-semiconductor (CMOS) processes may be used during front-end-of-line processing to build field-effect transistors in active device regions on a chip. Field-effect transistors generally include a semiconductor body, a source, a drain, and a gate electrode overlapping a channel region of the semiconductor body. When a control voltage exceeding a characteristic threshold voltage is applied to the gate electrode, carrier flow occurs in the channel region between the source and drain to produce a device output current. A back-end-of-line (BEOL) interconnect structure may be used to connect the field-effect transistors with each other and also with the environment external to the chip.

Field-effect transistors may be utilized in large-area devices having multiple active device regions, such as a resistor-capacitor clamp, high-voltage applications involving laterally-diffused metal-oxide-semiconductor transistors, large-area power devices capable of handling high currents, and radiofrequency applications. Conventional source and drain connections may utilize equal-length interconnects in the BEOL interconnect structure arranged over the active device regions of a large-area device and that extend fully across the active device regions of the large-area device. As the device area increases with an increasing number of active device regions, the current distribution in the interconnects coupled to the sources and drains of a large-area device may become increasingly non-uniform. In addition, the resistance associated with the interconnects may also increase with increasing device area.

Improved back-end-of-line layout structures and methods of forming a back-end-of-line layout structure are needed.

SUMMARY

In an embodiment of the invention, a structure includes a plurality of active device regions and a metallization level including a plurality of interconnects positioned over the plurality of active device regions. The plurality of interconnects have a triangular-shaped layout and a plurality of lengths within the triangular-shaped layout.

In an embodiment of the invention, a method includes forming a plurality of active device regions and forming a metallization level including a plurality of interconnects positioned over the plurality of active device regions. The plurality of interconnects have a triangular-shaped layout and a plurality of lengths within the triangular-shaped layout.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
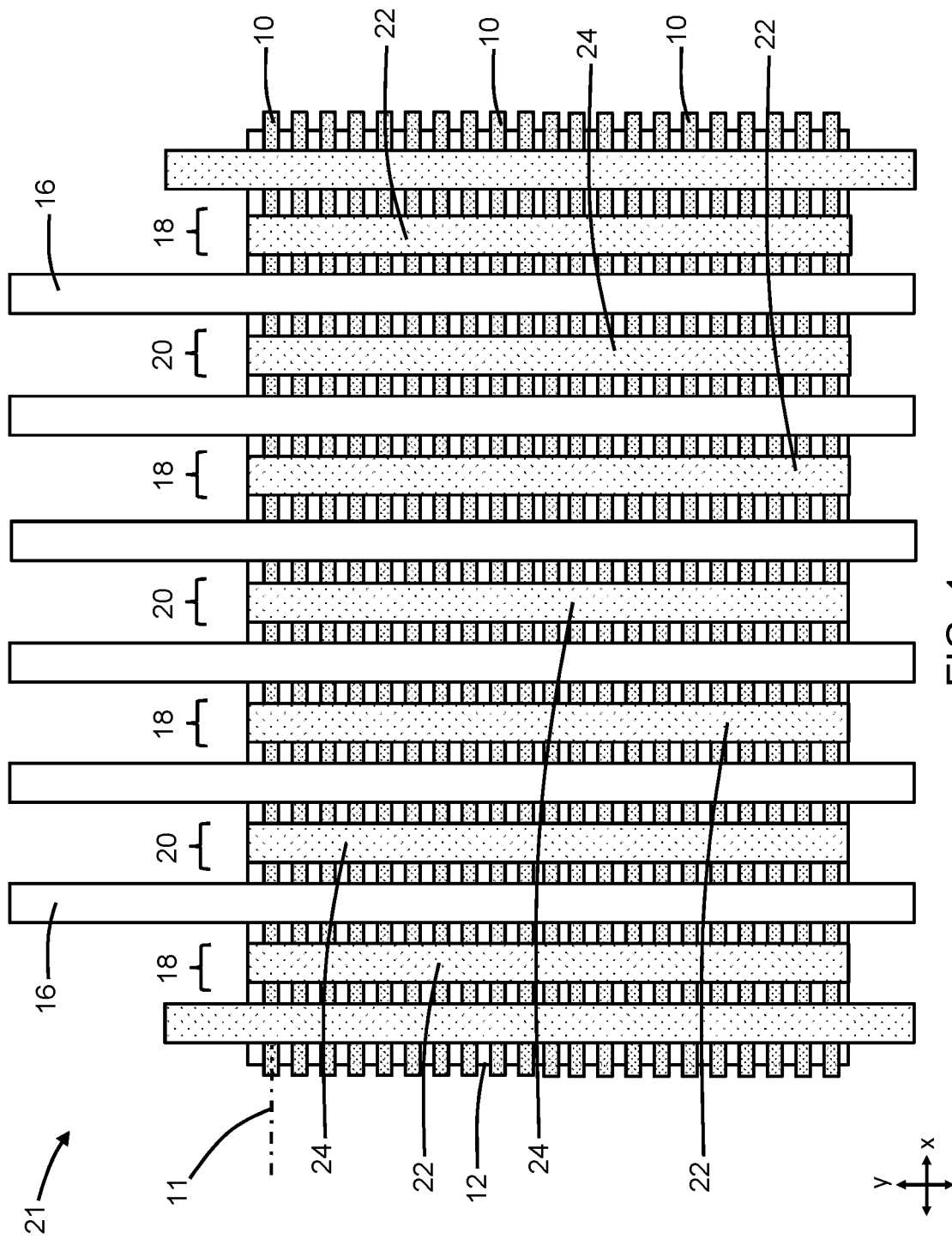
FIG. 1 is a top view of a structure at an initial fabrication stage of a processing method in accordance with embodiments of the invention.

With reference to FIG. 1 and in accordance with embodiments of the invention, a structure includes fins 10 that are arranged over, and project upwardly away from, an active device region 12. The fins 10 and the active device region 12 may be composed of a single-crystal semiconductor material, such as single-crystal silicon. The active device region 12 may be a portion of a semiconductor substrate that is surrounded by shallow trench isolation (not shown) that is formed in the semiconductor substrate, and the fins 10 may be partially buried in trench isolation that is formed over the semiconductor substrate. The fins 10 may be formed by patterning the semiconductor substrate with lithography and etching processes, or a multiple patterning process, and cutting the patterned fins 10 into given lengths. The fins 10 are aligned along respective longitudinal axes 11, and the fins 10 may have a parallel or substantially parallel arrangement in an array.

Gate electrodes 16 extend laterally along respective longitudinal axes over and across the fins 10. The gate electrodes 16 have a spaced-apart arrangement distanced transverse to the respective longitudinal axes 11 of the fins 10. Each gate electrode 16 overlaps with, and wraps about, respective lengthwise sections (e.g., channel regions) of the fins 10. The gate electrodes 16 may be composed of heavily-doped polysilicon that is deposited as a blanket layer over the fins 10 and then patterned with lithography and etching processes. A thin dielectric layer (not shown) composed of, for example, silicon dioxide, may be arranged between the fins 10 and the gate electrodes 16.

Source/drain regions 18 and source/drain regions 20 are coupled to the fins 10 at laterally-spaced locations between the spacer-clad gate electrodes 16. As used herein, the term "source/drain region" means a doped region of semiconductor material that can function as either a source or a drain of a field-effect transistor. In an embodiment, the source/drain regions 18 may provide source regions of the field-effect transistor, and the source/drain regions 20 may provide drain regions of the field-effect transistor. The source/drain regions 18 alternate with the source/drain regions 20 along the respective longitudinal axes 11 of the fins 10.

The source/drain regions 18 and source/drain regions 20 may be formed by the epitaxial growth of a semiconductor material from surfaces of the fins 10, and their formation may occur after the gate electrodes 16 are formed. The source/drain regions 18 and the source/drain regions 20 may be doped with a conductivity type of the same polarity. For example, the source/drain regions 18, 20 may all contain an n-type dopant (e.g., phosphorus and/or arsenic) that provides n-type conductivity. Alternatively, the source/drain regions 18, 20 may all contain a p-type dopant (e.g., boron) that provides p-type conductivity.

The fins 10, gate electrodes 16, source/drain regions 18, and source/drain regions 20 may constitute elements of a fin-type field-effect transistor 21 that is fabricated using the active device region 12. Dielectric sidewall spacers (not shown) are arranged adjacent to the sidewalls of the gate electrodes 16, and the dielectric sidewall spacers may provide the gaps between the gate electrodes 16 and source/drain regions 18, 20.

Lower-level contacts 22 are formed that are physically and electrically connected in direct contact with the source/drain regions 18. Lower-level contacts 24 are formed that are physically and electrically connected in direct contact with the source/drain regions 20. The lower-level contacts 22, 24 may contain a metal silicide, such as tungsten silicide, titanium silicide, nickel silicide, or cobalt silicide. The lower-level contacts 22, 24 may be deposited by, for example, chemical vapor deposition, and recessed with a selective etching process.

Figure 2:
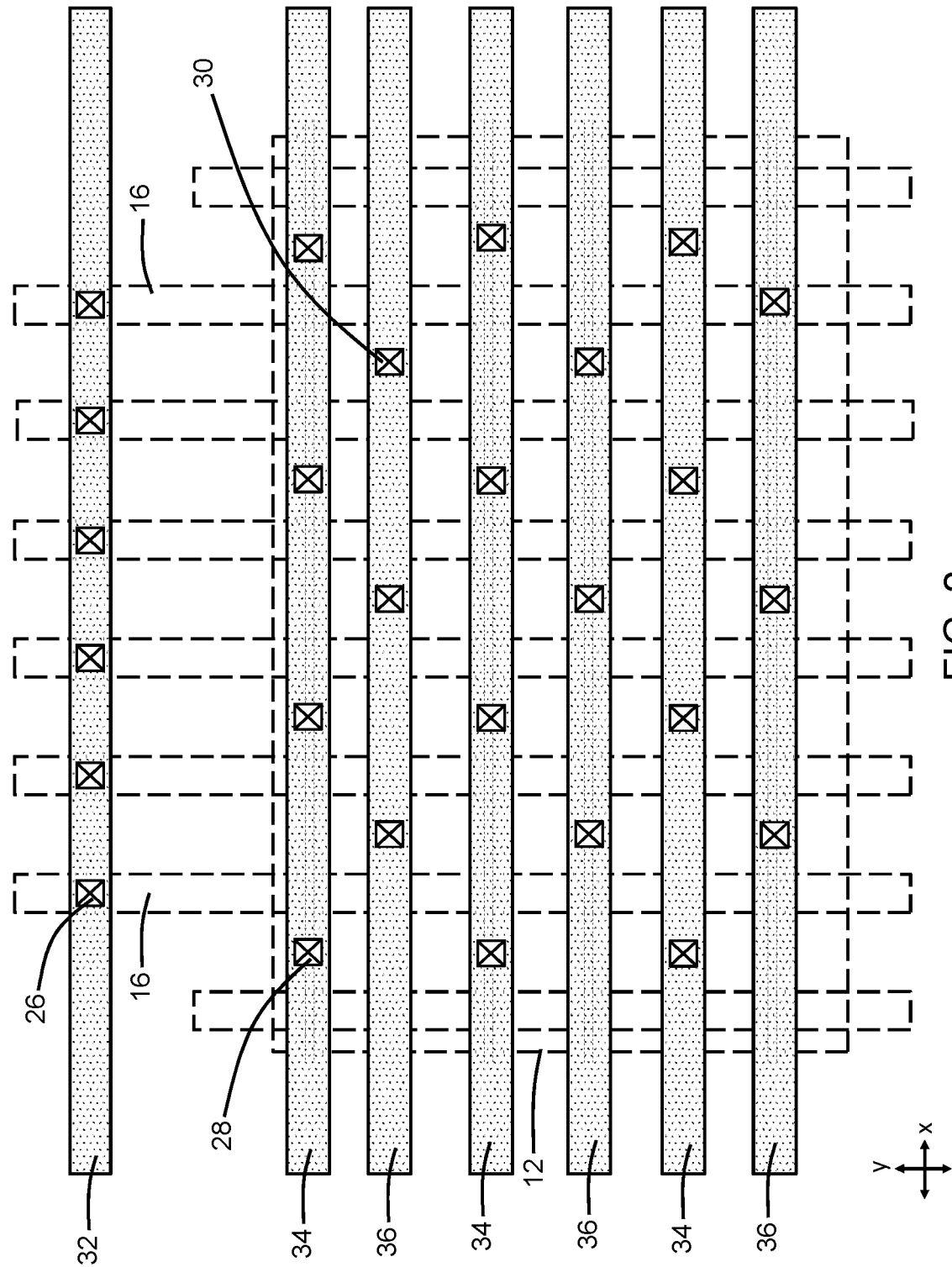
FIG. 2 is a top view of the structure at a fabrication stage of the processing method subsequent to FIG. 1.
Figure 3:
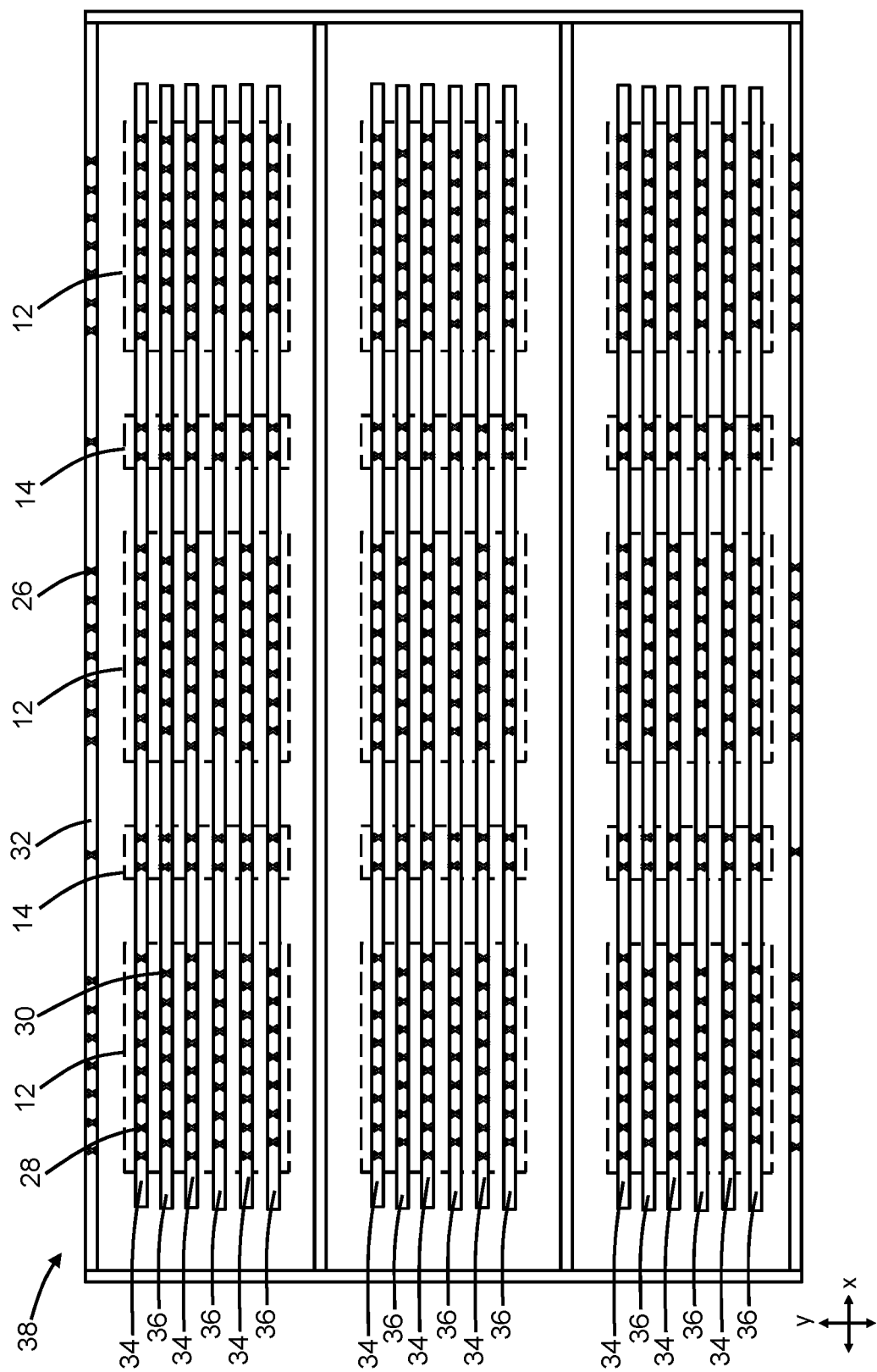
FIG. 3 is a simplified top view of a large-area device structure that includes multiple instances of the structure of FIG. 2.

With reference to FIGS. 2, 3 in which like reference numerals refer to like features in FIG. 1 and at a subsequent fabrication stage of the processing method, the field-effect transistor 21 (FIG. 1) may be used to form a large-area device structure (FIG. 3) in which the field-effect transistor 21 is replicated to define multiple field-effect transistors placed in islands defined by additional active device regions 12. The active device regions 12 may be arranged, for example, in an array of rows and columns. The number of rows and columns of islands may be larger than shown in FIG. 3, which shows an exemplary arrangement of active device regions 12. For example, the islands may be arranged in an array that includes six (6) rows and ten (10) columns of active device regions 12. Body contact regions 14 may be provided at locations between the adjacent active device regions 12.

An interconnect structure is formed over the large-area device structure to provide connections to the different field-effect transistors 21. To that end, upper-level contacts 26, 28, 30 are formed in a contact level that includes an interlayer dielectric layer deposited over the field-effect transistors and planarized. The upper-level contacts 26, 28, 30 may be composed of a metal, such as tungsten, and may be formed by a middle-of-line processing technique. The upper-level contacts 26 are coupled to the gate electrodes 16, the upper-level contacts 28 are coupled to the lower-level contacts 22 and thereby the source/drain regions 18, and upper-level contacts 30 are coupled to the lower-level contacts 24 and thereby the source/drain regions 20.

Interconnects 32, 34, 36 are formed over the field-effect transistors in a metallization level 38 of the interconnect structure and may be formed by a back-end-of-line (BEOL) processing technique, such as a damascene process. The metallization level 38 includes an interlayer dielectric layer (not shown) that may be composed of an electrical insulator, such as silicon dioxide. The interconnects 32, 34, 36 may be composed of a metal such as copper, aluminum, or cobalt, with additional liner and barrier layers (e.g., tantalum nitride, tantalum, titanium, or titanium nitride) also present.

The interconnects 34 have a parallel or substantially parallel arrangement over the array of active device regions 12. The interconnects 36 also have a parallel or substantially parallel arrangement over the array of active device regions 12. The interconnects 32 are arranged at the periphery of the array of active device regions 12 and define a gate ring cage that surrounds the array of active device regions 12. The interconnects 34, 36 are aligned parallel or substantially parallel to the longitudinal axes 11 of the fins 10. The interconnects 34, 36 are aligned transverse or substantially transverse to the longitudinal axes of the gate electrodes 16 and the lower-level contacts 22, 24.

The interconnects 32 are coupled to the gate electrodes 16 by the upper-level contacts 26. The interconnects 34 are coupled to the source/drain regions 18 by the upper-level contacts 28 and the lower-level contacts 22. The interconnects 36 are coupled to the source/drain regions 20 by the upper-level contacts 30 and the lower-level contacts 24. The upper-level contacts 26, 28, 30 supply vertical interconnections in the interconnect structure to the interconnects 32, 34, 36.

Figure 4:
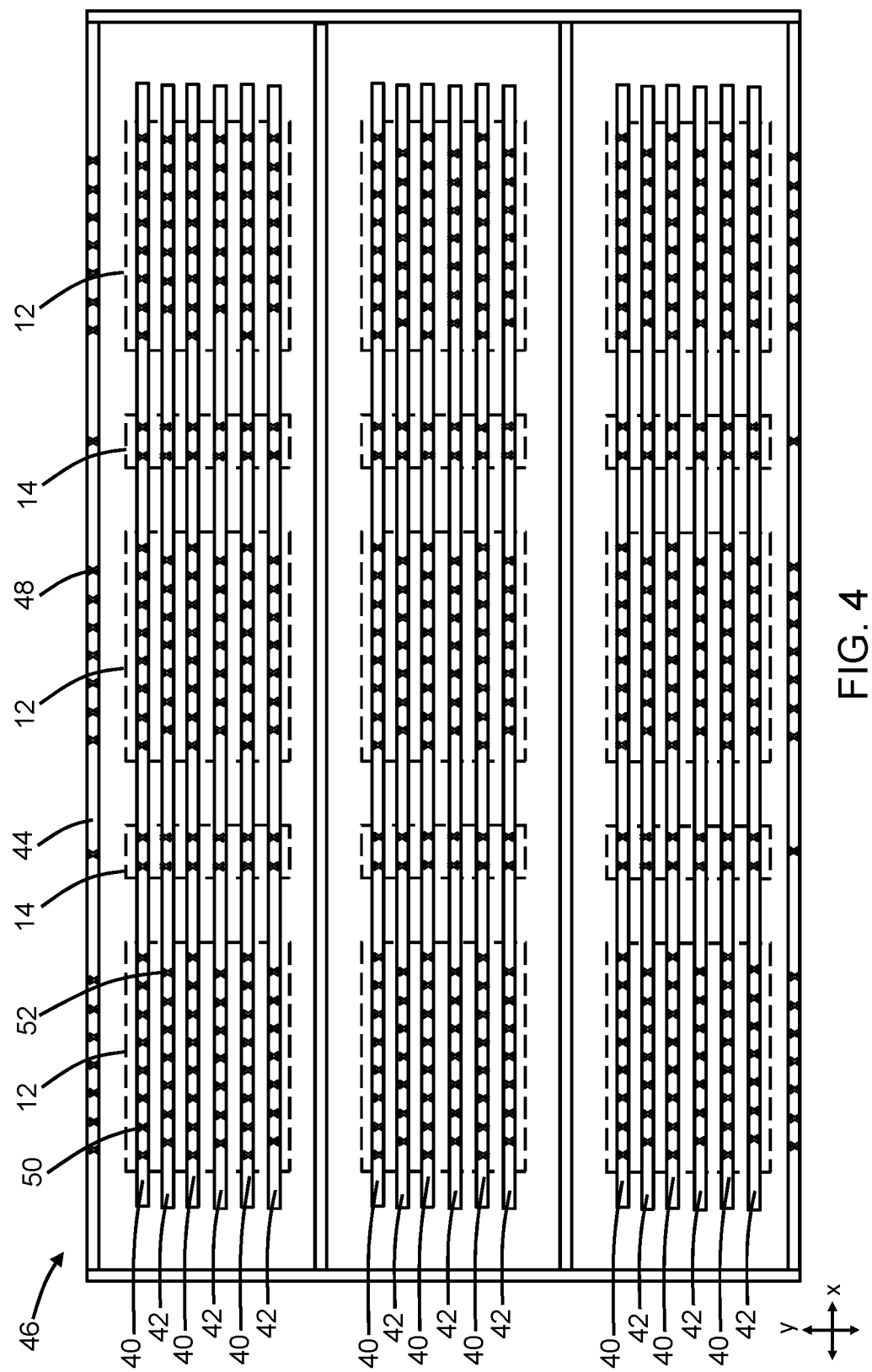
FIG. 4 is a top view of the large-area device structure at a fabrication stage of the processing method subsequent to FIG. 3.

With reference to FIG. 4 in which like reference numerals refer to like features in FIG. 3 and at a subsequent fabrication stage of the processing method, interconnects 40, 42, 44 are formed as wires in a metallization level 46 of the interconnect structure. The metallization level 46 is located over the metallization level 38. In an embodiment, the metallization level 38 may be a first metal (M1) level, and the metallization level 46 may be a second metal (M2) level.

The metallization level 46 includes an interlayer dielectric layer (not shown) that may be composed of an electrical insulator, such as silicon dioxide. The interconnects 40, 42, 44 may be composed of a metal such as copper, aluminum, or cobalt, with additional liner and barrier layers (e.g., tantalum nitride, tantalum, titanium, or titanium nitride) also present. The interconnects 40, 42 have a parallel or substantially parallel arrangement in which the interconnects 40 alternate with the interconnects 42 in the space over the array of active device regions 12, and the interconnects 44 are arranged at the periphery of the active device region 12. The interconnects 40 are aligned parallel or substantially parallel to the interconnects 34 and disposed above the interconnects 34, and the interconnects 42 are aligned parallel or substantially parallel to the interconnects 36 and disposed above the interconnects 36.

The interconnects 44 are coupled by vias 48 with the interconnects 32 and are thereby coupled to the gate electrodes 16. The interconnects 44 in the metallization level 46 define another gate ring cage that mirrors the gate ring cage defined by the interconnects 32 in the underlying metallization level 38. The interconnects 40 are coupled by vias 50 with the interconnects 34 and are thereby coupled to the source/drain regions 18. The interconnects 42 are coupled by vias 52 with the interconnects 36 and are thereby coupled to the source/drain regions 20. The vias 48, 50, 52 supply vertical interconnections in the interconnect structure between the interconnects 32, 34, 36 and the interconnects 40, 42, 44. The vias 48, 50, 52 may be formed from the same material as the interconnects 40, 42, 44 and may be concurrently formed with the interconnects 40, 42, 44 in a dual-damascene process.

Figure 5:
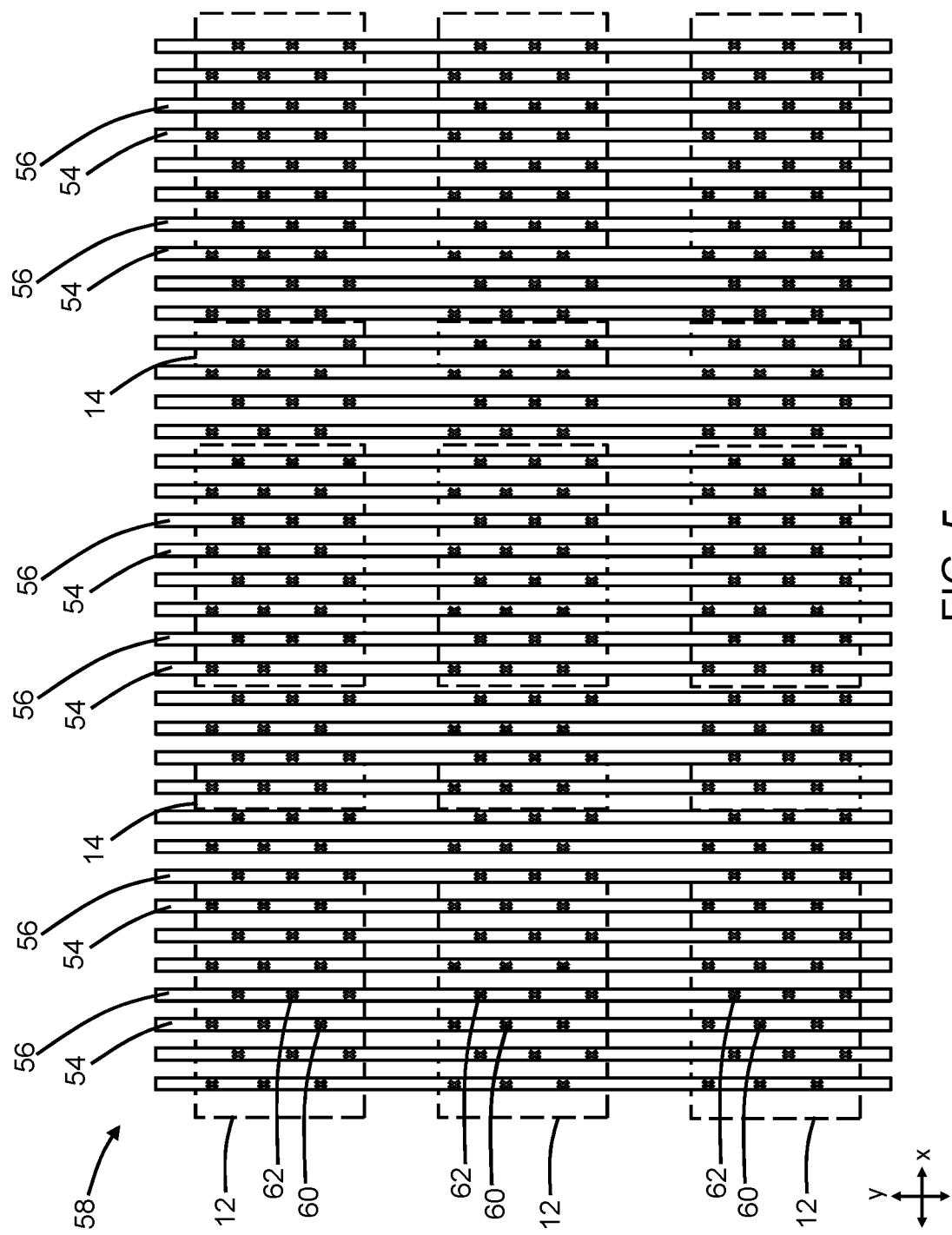
FIG. 5 is a top view of the large-area device structure at a fabrication stage of the processing method subsequent to FIG. 4.

With reference to FIG. 5 in which like reference numerals refer to like features in FIG. 4 and at a subsequent fabrication stage of the processing method, interconnects 54, 56 are formed as wires in a metallization level 58 of the back-end-of-line interconnect structure. The metallization level 58 is arranged over the metallization level 46 in the interconnect structure. The metallization level 58 may be a third metal (M3) level of the interconnect structure.

The metallization level 58 includes an interlayer dielectric layer (not shown) that may be composed of an electrical insulator, such as silicon dioxide. The interconnects 54, 56 may be composed of a metal such as copper, aluminum, or cobalt, with additional liner and barrier layers (e.g., tantalum nitride, tantalum, titanium, or titanium nitride) also present. The interconnects 54, 56 have a parallel or substantially parallel arrangement in which the interconnects 54 alternate with the interconnects 56 in the space over the array of active device regions 12. The interconnects 54 are aligned transverse or substantially transverse to the interconnects 40, and the interconnects 56 are aligned transverse or substantially transverse to the interconnects 42. The interconnects 54, 56 are aligned transverse to the longitudinal axes 11 of the fins 10.

The interconnects 54 are coupled by vias 60 with the interconnects 40 and, therefore, are coupled to the source/drain regions 18. The interconnects 56 are coupled by vias 62 with the interconnects 42 and, therefore, are coupled to the source/drain regions 20. The vias 60, 62 supply vertical interconnections in the interconnect structure between the interconnects 40, 42, and the interconnects 54, 56. The vias 60, 62 may be formed from the same material as the interconnects 54, 56 and may be concurrently formed with the interconnects 54, 56 in a damascene process.

Figure 6:
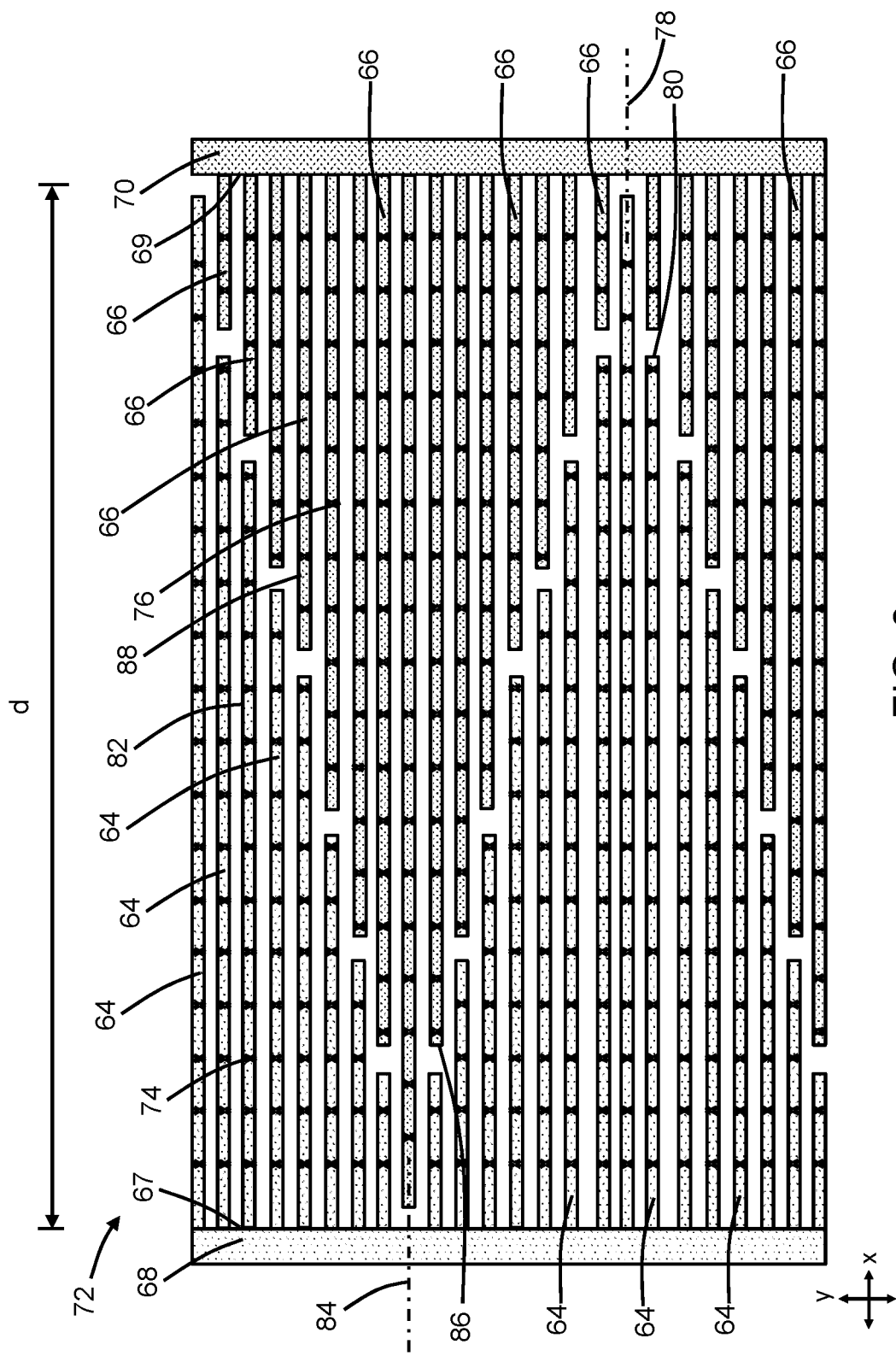
FIG. 6 is a top view of the large-area device structure at a fabrication stage of the processing method subsequent to FIG. 5.

With reference to FIG. 6 in which like reference numerals refer to like features in FIG. 5 and at a subsequent fabrication stage of the processing method, interconnects 64, 66 and transverse interconnects 68, 70 are formed as wires in a metallization level 72 of the back-end-of-line interconnect structure. The metallization level 72 is arranged over the metallization level 58 in the interconnect structure with the metallization level 58 positioned in a plane between a plane containing the metallization level 72 and a plane containing the metallization level 46. The metallization level 72 may be a fourth metal (M4) level of the interconnect structure. Multiple metallization levels 38, 46, 58 are positioned between the source/drain regions 18 and the metallization level 72 and also between the source/drain regions 20 and the metallization level 72. In an embodiment, exactly three metallization levels 38, 46, 58 may be positioned between the source/drain regions 18 and the metallization level 72 and also between the source/drain regions 20 and the metallization level 72.

The metallization level 72 includes an interlayer dielectric layer (not shown) that may be composed of an electrical insulator, such as silicon dioxide. The interconnects 64, 66, 68, 70 may be composed of a metal such as copper, aluminum, or cobalt, with additional liner and barrier layers (e.g., tantalum nitride, tantalum, titanium, or titanium nitride) also present. The interconnects 64 have a parallel or substantially parallel arrangement over the array of active device regions 12 and the interconnects 44 are arranged at the periphery of the active device region 12. The interconnects 64 are aligned transverse or substantially transverse to the interconnects 54 in metallization level 58, and the interconnects 66 are aligned transverse or substantially transverse to the interconnects 56 in metallization level 58. The interconnects 64, 66 are aligned parallel to the longitudinal axes 11 of the fins 10.

The interconnects 64 are coupled by vias 74 with the interconnects 54 and are thereby coupled to the source/drain regions 18. The interconnects 66 are coupled by vias 76 with the interconnects 56 and are thereby coupled to the source/drain regions 20. The vias 74, 76 supply vertical interconnections in the interconnect structure between the interconnects 54, 56 and the interconnects 64, 66. The vias 74, 76 may be formed from the same material as the interconnects 64, 66 and may be concurrently formed with the interconnects 64, 66 in a damascene process. The source/drain regions 18 are all connected by the interconnects 64 with the transverse interconnect 68, and the source/drain regions 20 are all connected by the interconnects 66 with the transverse interconnect 70.

The interconnects 64 are connected at one end to a side surface 67 of the transverse interconnect 68, which is aligned transverse or substantially transverse to the interconnects 64. The interconnects 64 extend laterally from the side surface 67 of the transverse interconnect 68 toward the side surface 69 of the transverse interconnect 70 but have respective ends 80 that terminate with a series of different spacings from the side surface 69 according to length. The interconnects 66 are connected at one end to a side surface 69 of the transverse interconnect 70, which is aligned transverse or substantially transverse to the interconnects 66. The interconnects 66 extend laterally from the side surface 69 of the transverse interconnect 70 toward the side surface 67 of the transverse interconnect 68 but have respective ends 86 that terminate with a series of different spacings from the side surface 67 according to length.

The interconnects 64 represent multiple fingers of varying length that are all connected to the source/drain regions 18 by the interconnects 54 in metallization level 58, the interconnects 40 in the metallization level 46, and the interconnects 34 in the metallization level 38. The interconnects 64 have different lengths relative to the side surface 67 of the transverse interconnect 68. For this reason, the alignment of the interconnects 54 in the metallization level 58 parallel to the upper-level contacts 28 provides connection points for the interconnects 64 to be coupled with the source/drain regions 18.

Each of the interconnects 64 extends from the side surface 67 of the transverse interconnect 68 along a longitudinal axis 78 and terminates at one of the ends 80. The lengths of the interconnects 64 may be measured between the respective terminating ends 80 and the side surface 67 of the transverse interconnect 68. The lengths of the interconnects 64 are less than (i.e., shorter than) the distance, d, separating the side surface 67 of the transverse interconnect 68 from the side surface 69 of the transverse interconnect 70. The longitudinal axes 78 may be oriented orthogonal to the side surface 67 of the transverse interconnect 68 and orthogonal to the side surface 69 of the transverse interconnect 70.

The interconnects 64 may be wires that have rectangular or substantially rectangular cross-sections in a plane that is normal to the longitudinal axis 78, and the interconnects 64 have side surfaces or sidewalls 82 that intersect the side surface 67 of the transverse interconnect 68. The sidewalls 82 of each interconnect 64 also terminate at the end 80 that is opposite from the intersection with the side surface 67 of the transverse interconnect 68. The width between the sidewalls 82 is significantly less than that lengths of the interconnects 64. The interconnects 64 are not connected with each other in the space over the active device regions 12 and between the transverse interconnects 68, 70. Instead, the sidewalls 82 of the individual interconnects 64 are separated by gaps filled by dielectric material from the interlayer dielectric layer such that the interconnects 64 are electrically isolated from each other over the active device regions 12.

The interconnects 64 are arranged in sets that are inset inside of a triangular-shaped envelope and have a triangular-shaped layout. The interconnects 64 have a pitch in a lateral direction transverse to the longitudinal axes 78. One of the interconnects 64 in each set has the greatest length of all interconnects 64 and may be centrally arranged in a lateral direction between respective interconnects 64 of shorter length. The lengths of the interconnects 64 progressively decrease with increasing separation from the interconnect 64 of greatest length. For example, the lengths of the interconnects 64 may progressively decrease according to a linear function. A gap is included between adjacent sets of interconnects 64 and represents a space that lacks one of the interconnects 64.

The interconnects 66 represent multiple fingers of varying length that are all connected to the source/drain regions 20 by the interconnects 56 in metallization level 58, the interconnects 42 in the metallization level 46, and the interconnects 36 in the metallization level 38. The interconnects 66 have different lengths relative to the side surface 69 of the transverse interconnect 70. For this reason, the alignment of the interconnects 56 in the metallization level 58 parallel to the upper-level contacts 30 provides connection points for the interconnects 66 to be coupled with the source/drain regions 20.

Each of the interconnects 66 extends from the side surface 69 of the transverse interconnect 70 along a longitudinal axis 84 and terminates at one of the ends 86. The lengths of the interconnects 66 may be measured between the respective terminating ends 86 and the side surface 69 of the transverse interconnect 70. The lengths of the interconnects 66 are less than (i.e., shorter than) the distance, d, separating the side surface 67 of the transverse interconnect 68 from the side surface 69 of the transverse interconnect 70. The longitudinal axes 84 may be oriented orthogonal to the side surface 67 of the transverse interconnect 68 and orthogonal to the side surface 69 of the transverse interconnect 70.

The interconnects 66 may be wires that have rectangular or substantially rectangular cross-sections in a plane that is normal to the longitudinal axis 84, and the interconnects 66 have side surfaces or sidewalls 88 that intersect the side surface 69 of the transverse interconnect 70. The sidewalls 88 of each interconnect 66 also terminate at the end 86 that is opposite from the intersection with the side surface 69 of the transverse interconnect 70. The width between the sidewalls 88 is significantly less than that lengths of the interconnects 66. The interconnects 66 are not connected with each other in the space over the active device regions 12 and between the transverse interconnects 68, 70. Instead, the sidewalls 88 of the individual interconnects 66 are separated by gaps filled by dielectric material from the interlayer dielectric layer such that the interconnects 66 are electrically isolated from each other over the active device regions 12.

The interconnects 66 are arranged in sets that are inset inside of a triangular-shaped envelope and have a triangular-shaped layout. The interconnects 66 have a pitch in a lateral direction transverse to the longitudinal axes 84. One of the interconnects 66 in each set has the greatest length of all interconnects 66 and may be centrally arranged in a lateral direction between respective interconnects 66 of shorter length. The lengths of the interconnects 66 progressively decrease with increasing separation from the interconnect 66 of greatest length. For example, the lengths of the interconnects 66 may progressively decrease according to a linear function. A gap is included between adjacent sets of interconnects 66 and represents a space that lacks one of the interconnects 66.

The triangular-shaped envelope and layout of the interconnects 64 is oriented in one transverse direction (e.g., the positive x-direction), and the triangular-shaped envelope and layout of the interconnects 66 is oriented in an opposite transverse direction (e.g., the negative x-direction). The triangular-shaped layout of the interconnects 64 in a given set and the triangular-shaped layout of the interconnects 66 in a given set may have an adjacent placement in the layout. The longitudinal axes 78 of the interconnects 64 may be aligned collinear with the longitudinal axes 84 of the interconnects 66. Where the longitudinal axes 78, 84 are collinearly aligned, the terminating ends 80 of the interconnects 64 are spaced from the terminating ends 86 of the interconnects 64 by respective gaps.

The spaces between the interconnects 64, 66, the space between the terminating end 80 of the longest interconnect 64 and the transverse interconnect 68, the space between the terminating end 86 of the longest interconnect 66 and the transverse interconnect 70, and the spaces between the terminating ends 80 of the interconnects 64 and the terminating ends 86 of the interconnects 66 are filled by portions of dielectric material from the interlayer dielectric layer of the metallization level 72. The dielectric material, which surrounds the interconnects 64, 66, 68, 70, provides electrical isolation between the connections to the source/drain regions 18 and the connections to the source/drain regions 20.

The interconnects 64 may improve the uniformity of current distribution for the source/drain regions 18, during operation, due to the multiple-length, multiple-finger arrangement with a triangular-shaped layout over the source/drain regions 18. Similarly, the interconnects 66 may improve the uniformity of current distribution for the source/drain regions 20, during operation, due to the multiple-length, multiple-finger arrangement with a triangular-shaped layout over the source/drain regions 20. In each instance, the electrical resistance may be reduced without a chip area penalty. The inventive interconnect structure may be used in conjunction with other types of large-area devices, such as bulk large-area devices or silicon-on-insulator large-area devices.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected"

or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a plurality of active device regions; and
   a first metallization level including a first transverse interconnect with a first side surface and a first plurality of interconnects that are positioned over the plurality of active device regions, each of the first plurality of interconnects coupled to the first side surface of the first transverse interconnect, and the first plurality of interconnects having a first triangular-shaped layout and a first plurality of lengths within the first triangular-shaped layout.

2. The structure of claim 1 wherein each of the first plurality of interconnects is aligned along a respective longitudinal axis that is oriented orthogonal to the first side surface of the first transverse interconnect, and the first plurality of lengths of the first plurality of interconnects are measured relative to the first side surface of the first transverse interconnect.

3. The structure of claim 1 wherein each of the first plurality of interconnects has a terminating end opposite from the first side surface of the first transverse interconnect.

4. A structure comprising:
   a plurality of active device regions; and
   a first metallization level including a first plurality of interconnects positioned over the plurality of active device regions and a second plurality of interconnects positioned over the plurality of active device regions, the first plurality of interconnects having a first triangular-shaped layout and a first plurality of lengths within the first triangular-shaped layout, and the second plurality of interconnects having a second triangular-shaped layout with a second plurality of lengths within the second triangular-shaped layout.

5. The structure of claim 4 wherein the first triangular-shaped layout and the second triangular-shaped layout are oriented in opposite directions.

6. The structure of claim 4 wherein the first metallization level includes a first transverse interconnect with a first side surface and a second transverse interconnect with a second side surface, each of the first plurality of interconnects is coupled to the first side surface of the first transverse interconnect, and each of the second plurality of interconnects is coupled to the second side surface of the second transverse interconnect.

7. The structure of claim 6 wherein the first triangular-shaped layout is oriented in a first direction relative to the first side surface of the first transverse interconnect, the second triangular-shaped layout is oriented in a second direction relative to the second side surface of the second transverse interconnect, and the first direction is opposite to the second direction.

8. The structure of claim 6 wherein the first plurality of interconnects are positioned between the first side surface of the first transverse interconnect and the second side surface of the second transverse interconnect, and the second plurality of interconnects are positioned between the first side surface of the first transverse interconnect and the second side surface of the second transverse interconnect.

9. The structure of claim 1 further comprising:
   a second metallization level including a second plurality of interconnects positioned over the plurality of active device regions, the second plurality of interconnects aligned transverse to the first plurality of interconnects, and the second plurality of interconnects coupled to the first plurality of interconnects.

10. The structure of claim 9 wherein the second metallization level is positioned between the first metallization level and the plurality of active device regions, and further comprising:
    a plurality of field-effect transistors in the plurality of active device regions, the plurality of field-effect transistors including a plurality of source/drain regions that are coupled by the second plurality of interconnects with the first plurality of interconnects.

11. The structure of claim 10 wherein the plurality of field-effect transistors include a plurality of semiconductor fins, the first plurality of interconnects are aligned transverse to the plurality of semiconductor fins, and the second plurality of interconnects are aligned transverse to the plurality of semiconductor fins.

12. The structure of claim 10 further comprising:
    a third metallization level including a third plurality of interconnects positioned over the plurality of active device regions, the third plurality of interconnects oriented parallel to the first plurality of interconnects, the third plurality of interconnects oriented transverse to the second plurality of interconnects, and the third plurality of interconnects coupled by the second plurality of interconnects to the first plurality of interconnects.

13. The structure of claim 12 wherein the plurality of field-effect transistors include a plurality of semiconductor fins, the first plurality of interconnects are aligned transverse to the plurality of semiconductor fins, the second plurality of interconnects are aligned transverse to the plurality of semiconductor fins, and the third plurality of interconnects are aligned parallel to the plurality of semiconductor fins.

14. A method comprising:
    forming a plurality of active device regions; and
    forming a first metallization level including a first plurality of interconnects positioned over the plurality of active device regions and a second plurality of interconnects positioned over the plurality of active device regions; and
    forming a second metallization level including a third plurality of interconnects positioned over the plurality of active device regions,
    wherein the first plurality of interconnects have a first triangular-shaped layout and a first plurality of lengths within the first triangular-shaped layout, the third plurality of interconnects are aligned transverse to the first plurality of interconnects, and the third plurality of interconnects are coupled to the first plurality of interconnects.

15. The method of claim 14 wherein the second plurality of interconnects have a second triangular-shaped layout with a second plurality of lengths within the second triangular-shaped layout.

16. The method of claim 15 wherein the first triangular-shaped layout and the second triangular-shaped layout are oriented in opposite directions.

17. The method of claim 15 wherein the second metallization level is positioned between the first metallization level and the plurality of active device regions, and further comprising:
   forming a plurality of field-effect transistors in the plurality of active device regions,
   wherein the plurality of field-effect transistors include a plurality of source/drain regions that are coupled by the third plurality of interconnects with the first plurality of interconnects.

18. The method of claim 17 wherein the plurality of field-effect transistors include a plurality of semiconductor fins, the first plurality of interconnects are aligned transverse to the plurality of semiconductor fins, and the third plurality of interconnects are aligned transverse to the plurality of semiconductor fins.

19. The structure of claim 4 wherein the first metallization level includes a first transverse interconnect with a first side surface, and each of the first plurality of interconnects is coupled to the first side surface of the first transverse interconnect.

20. The structure of claim 19 wherein each of the first plurality of interconnects is aligned along a respective longitudinal axis that is oriented orthogonal to the first side surface of the first transverse interconnect, and the first plurality of lengths of the first plurality of interconnects are measured relative to the first side surface of the first transverse interconnect.

* * * * *